(12) United States Patent  (10) Patent No.: US 8,153,495 B2
Yeh et al.  (45) Date of Patent: Apr. 10, 2012

(54) SEMICONDUCTOR DEVICE AND LTPS-TFT WITHIN AND METHOD OF MAKING THE SAME

(75) Inventors: Kuang-Chao Yeh, Ping Chen (TW); Wen-Bin Hsu, Miaoli Hsien (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/261,816

(22) Filed: Oct. 30, 2008

(65) Prior Publication Data

US 2009/0061570 A1 Mar. 5, 2009

Related U.S. Application Data

(62) Division of application No. 11/120,966, filed on May 4, 2005, now abandoned.

(30) Foreign Application Priority Data

Jul. 9, 2004 (TW) .............................. 93120640 A

(51) Int. Cl.
*H01L 21/331* (2006.01)
(52) U.S. Cl. ....................... 438/369; 438/475
(58) Field of Classification Search .................. 438/369, 438/475
See application file for complete search history.

(56) References Cited

U.S. PATENT DOCUMENTS

| 5,162,892 A | 11/1992 | Hayashi et al. |
| 6,864,134 B1 | 3/2005 | Satou et al. |
| 2004/0016924 A1* | 1/2004 | Yamada et al. ................. 257/59 |

FOREIGN PATENT DOCUMENTS

WO WO-2004/030074 4/2004

* cited by examiner

*Primary Examiner* — Thien F Tran
(74) *Attorney, Agent, or Firm* — Muncy, Geissler, Olds & Lowe, PLLC

(57) ABSTRACT

A thin film transistor (TFT) formed on a substrate includes a polycrystalline film, a gate insulator, a hydrogen-supplying film and a gate electrode. The polycrystalline film is formed on the substrate. Two sides of the polycrystalline film serve as the source and the drain of the semiconductor device, and the central region of the polycrystalline layer serves as the channel. The gate insulator is formed on the polycrystalline film, then the polycrystalline film is ions implanted, and the hydrogen-supplying film is formed on the gate insulator. The gate electrode is formed on the hydrogen-supplying film above the channel. The hydrogen-supplying film supplies hydrogen to the polycrystalline film, especially to the channel, so as to transform the unsaturated bonds into hydrogen bonds in the channel for avoiding the unsaturated bonds to degrade the charge carrier efficiency of the channel.

10 Claims, 6 Drawing Sheets

SEMICONDUCTOR DEVICE AND LTPS-TFT WITHIN AND METHOD OF MAKING THE SAME

This application is a divisional application and claims the benefit of U.S. application Ser. No. 11/120,966, filed May 4, 2005 now abandoned incorporated by reference herein in its entirety.

BACKGROUND OF THE INVENTION (1) Field of the Invention

This invention relates generally to a Low Temperature Polycrystalline Si Thin Film transistor (LTPS-TFT), and more particularly to an LTPS-TFT having a hydrogen-supplying film to enhance hydrogenation.

(2) Description of the Prior Art

Thin film transistor liquid crystal displays (TFT-LCD) as a mature technology, can be categorized into the amorphous Si (α-Si) TFT-LCDs and the Low Temperature Polycrystalline Si (LTPS) TFT-LCDs. The α-Si TFT is a transistor using the amorphous Si as the material for the semiconductor layer. The LTPS-TFT is a transistor using the polycrystalline Si as the material for the semiconductor layer. The LTPS technology features a laser annealing, which can transform the Polycrystalline Si into the α-Si with a temperature lower than 500° C. For the technology of α-Si TFT-LCD is mature and low cost, so it is now the mainstream in the marketplace. However, because the LTPS TFT-LCD has various advantages superior to the α-Si TFT-LCD, so its application becomes one of the prospective technology in the flat panel display industry.

Referring to FIG. 1, a conventional semiconductor device having LTPS-TFTs is shown. In the fabricating process of the semiconductor device 10, first of all, a polycrystalline layer 14 is formed on a substrate 12. After a gate insulator 16 is formed on the polycrystalline layer 14, the polycrystalline layer 14 is performed thereupon an ion implantation to form separately a source 143 and a drain 145 and also to form a channel 141 in a central region of the polycrystalline layer 14. Subsequently, a gate electrode 18 is formed on an upper surface of the gate insulator 16, and is sited above the channel 141. Thereby, a basic MOS structure can be constructed by the gate electrode 18, the gate insulator 16 and the polycrystalline layer 14.

In order to manufacture a driving circuit with an n-MOS and a p-MOS (CMOS) in the LTPS-TFT, the polycrystalline layer 14 can undergo another ion implantation process so as to include predetermined ions for forming respectively the n-MOS and the p-MOS. The gate insulator 16 on the upper surface of the polycrystalline layer 14 provides a thickness to is substantially form a barrier for staying the implanted ions within a predetermined depth of the polycrystalline layer 14 after the ions passing through the gate insulator 16. The latter ion implantation is an ion activation process that can activate the ions at 400-1000° C. so as to make the polycrystalline layer 14 have the function of the semiconductor.

Still referring to FIG. 1, after the gate electrode 18 is formed, an inner layer dielectric (ILD) 22 is deposited on both the gate electrode 18 and the gate insulator 16. Thereafter, the ILD 22 and the gate insulator 16 are etched to form openings for exposing the source 143 and the drain 145, respectively. Then a metal is deposited into aforesaid openings to form the wire 143a on top of the source 143 and the wire 145a on top of the drain 145. Finally, a passivation layer 24 covers on the wire 143a, 145a and the ILD 22 to protect the semiconductor device 10 and so the TFT therein.

One characteristic of the LTPS-TFT is that there is a large number of unsaturated bonds in the polycrystalline Si layer of the LTPS-TFT for the laser annealing process is used. These unsaturated bonds can become charge carrier traps to affect charge moving in the channel 141, and thus further to result in a higher threshold voltage of the LTPS-TFT. In order to improve the current-voltage characteristic and reduce the threshold voltage, a fabricating method is introduced by adding a hydrogenation process to have the unsaturated bonds transformed into respective hydrogen bonds in the channel 141. Thereby, the aforesaid charge carrier traps can be mended and the threshold voltage of the LTPS-TFT can be reduced. The reality is that charge mobility is increased in the channel 141. U.S. Pat. No. 5,162,892 disclosed a polycrystalline Si layer that is 400 Å in thickness. When the polycrystalline Si layer does not undergo a hydrogenation process, its threshold voltage may be 11V and its carrier effective mobility may be 1 $cm^2/V$. But if the polycrystalline Si layer undergoes a hydrogenation process, its threshold voltage would drop to 7V and its carrier effective mobility would be increased to 20 $cm^2/V$.

In an early hydrogenation process, a hydrogen plasma is used to hydrogenate the channel 141. However, the hydrogen plasma may damage the semiconductor device 10 easily and thus to lower the yield. In the latter ion activation process or thermal resistance test, the high-temperature environment may result in escaping of the hydrogen from the polycrystalline layer 10 and may reduce the hydrogenation efficiency. At present, the general hydrogenation method uses the hydrogen-containing material as the passivation layer 24 and performs annealing onto semiconductor device 10. The hydrogen atoms go from the passivation layer 24 into the channel 141 by thermal effusion so as to repair the charge carrier traps. As shown in FIG. 1, the hydrogen atoms go from the passivation layer 24 to the channel 141 along the direction indicated by arrows around the gate electrode 18 in the hydrogenation process. When the semiconductor device 10 runs into the high temperature surroundings again, the hydrogen atoms can be encapsulated in the semiconductor device 10 by the passivation layer 24.

However, the method including forming the passivation layer 24 needs a longer annealing time. Referring to FIG. 1, along the direction indicated by the arrows, the hydrogen atoms can go from the passivation layer 24 down to the interlayer dielectric 22 around the gate electrode 18, then go through the gate insulator 16, and finally go into the channel 141. The aforesaid pathway is too far to achieve a shorter process time. U.S. Pat. No. 5,162,892 discloses that the annealing time and the carrier effective mobility of the TFT are positively correlated. The carrier effective mobility is 1 $cm^2/V$ before annealing. After an annealing for 8 hours, the effective mobility can increase to 20 $cm^2/V$.

In view of the aforementioned disadvantages in conventional process, the present inventor has devoted to improving and innovating a method for producing an acceptable semiconductor device and an internal LTPS-TFT.

SUMMARY OF THE INVENTION

The primary object of this invention is to provide a fabricating method of a low temperature polycrystalline Si.

The polycrystalline film formed on the substrate, in which two sides of the polycrystalline film are provided to form a source and a drain of the TFT respectively. A central region of the polycrystalline film forms a channel of the TFT. The gate insulator is formed on the polycrystalline film. The polycrystalline film is ions implanted. The hydrogen-supplying film is formed on the gate insulator. The gate electrode is formed on an upper surface of the hydrogen-supplying film above the channel of the TFT. The inner dielectric layer covers the gate electrode and the hydrogen-supplying film. Two wires are introduced to pass through the inner dielectric layer for contacting with the source and the drain of the polycrystalline film respectively. The passivation layer is formed to cover the inner dielectric layer 42 for protecting the semiconductor device.

The hydrogen-supplying film can supply hydrogen atoms to the channel of the polycrystalline film so as to transform unsaturated bonds into hydrogen bonds for stablizing charge carrier mobility in the channel. When the semiconductor device in application runs into the high temperature surroundings, the hydrogen atoms can be encapsulated in the semiconductor device by the passivation layer with silicon.

In the invention, the hydrogen-supplying film is formed between the gate electrode and the channel of the polycrystalline film. By providing the present method, the LTPS-TFT can be hydrogenated to improve the current-voltage characteristic and the operational efficiency of the LTPS-TFT can be increased. Comparing with the aforesaid conventional LTPS-TFT having the passivation layer with hydrogen, this invention having the passivation layer with silicon can reach a comparable efficiency in a shorter time, the hydrogenating efficiency of the present invention can be increased, and also the whole process time can be substantially shortened.

BRIEF DESCRIPTION OF THE DRAWINGS

The related drawings in connection with the detailed description of this invention, which is to be made later, are described briefly as follows, in which.

DESCRIPTION OF THE PREFERRED EMBODIMENTS

Figure 1:
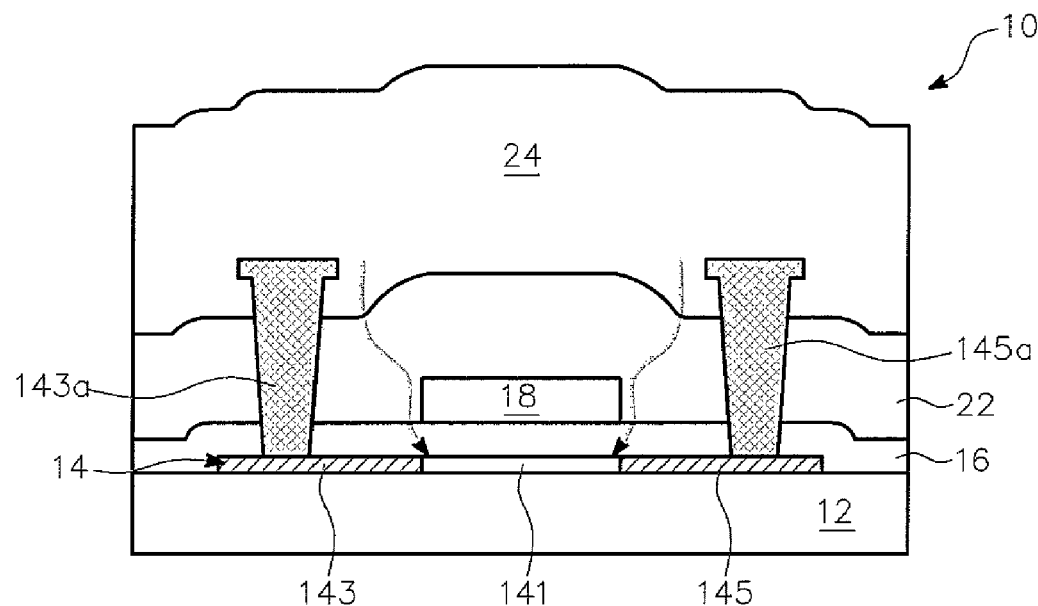
FIG. 1 is a conventional semiconductor device having an LTPS TFT.
Figure 2:
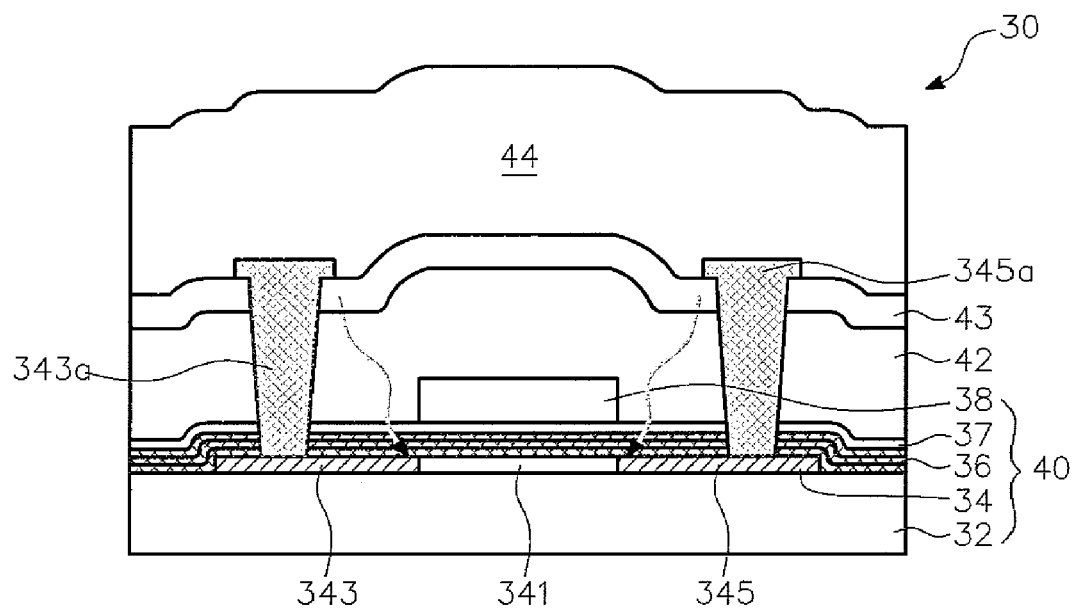
FIG. 2 is a preferred semiconductor having an internal TFT according to this invention.

Referring to FIG. 2, a semiconductor device 30 and an internal TFT 40 according to this invention are shown. The semiconductor device 30 includes a polycrystalline film 34 formed on a substrate 32, in which the polycrystalline film 34 has two sides thereof to form a source 343 and a drain 345 of the TFT 40, respectively. A central region of the polycrystalline film 34 is formed as a channel 341 of the TFT 40. A gate insulator 36 is formed as a multi-layer structure on the polycrystalline film 34. A hydrogen-supplying film 37 is further formed on the gate insulator 36. A gate electrode 38 is formed on an upper surface of the hydrogen-supplying film 37 above the channel 341 of the TFT 40. Upon such an arrangement, the TFT 40 of the invention is constituted of the polycrystalline film 34, the gate insulator 36, hydrogen-supplying film 37 and the gate electrode 38. As shown, an inner dielectric layer 42 covers both the gate electrode 38 and the hydrogen-supplying film 37. Two wires 343a, 345a passing through the inner dielectric layer 42 are constructed to contact with the source 423 and the drain 345 of the polycrystalline film 34, respectively. Finally, a passivation layer 44 covering the inner dielectric layer 42 is used to encapsulate the whole semiconductor device 30.

As shown in FIG. 2, the hydrogen-supplying film 37 as one of many characteristics of the present invention can supply hydrogen atoms to the channel 341 of the polycrystalline film 34 (following the arrows as shown) so as to transform a plurality of unsaturated bonds into respective hydrogen bonds and thus to avoid possible reduction in charge carrier mobility in the channel 341. In order to resolve the disadvantages of prior art described above, such as the lengthy hydrogenation pathway or the prolonged fabrication process time, the hydrogen-supplying film 37 neighboring the polycrystalline film 34 is designed as a source to provide hydrogen atoms for hydrogenating the polycrystalline film 34, and thereby the hydrogen pathway can be shortened. For the passivation layer 44 contains a silicon nitride with a particular number of hydrogen atoms, so the passivation layer 44 can be also used as another source to supply hydrogen atoms to the polycrystalline film 34. Upon such an arrangement, the hydrogen atoms can be prevented from escaping from the semiconductor device 30 in higher temperature surroundings.

Note that hydrogen-supplying film 37 is located between the gate electrode 38 and the polycrystalline film 34. If the hydrogen-supplying film 37 presents an acceptable dielectric characteristic, degrading in the efficiency of the TFT 40 can be avoided. In one preferred embodiment, the tetraethyl-orthosilicate (TEOS), well known in the market, is chosen as the material for both the hydrogen-supplying film 37 and the gate insulator 36. In addition, the gate insulator is a multi-layer structure of tetra-ethyl-orthosilicate (TEOS). Comparing with other materials, such as a silicon oxide, the TEOS contains more hydrogen atoms and thus is much suitable to be the hydrogen source. When the hydrogen-supplying film 37 is made thicker, it can supply more hydrogen atoms and enhance the hydrogenation. The total thickness of the hydrogen-supplying film 37 and the gate insulator 36 dominates the dielectric characteristic between the gate 38 and the channel 341. In particular, the total thickness of the hydrogen-supplying film 37 and the gate insulator 36 can range between 700~1000 Å, while the thickness of the hydrogen-supplying film 37 is between 100~600 Å.

The TEOS can be used as the material for the hydrogen-supplying film 37 and the material for the gate insulator 36. However, when the gate insulator 36 and the polycrystalline film 34 undergo an ion implantation in a high temperature process, the hydrogen atoms in the gate insulator 36 can escape to fail the ability of the gate insulator 36 to supply the hydrogen atoms. The aforesaid ion implantation will be described in a latter section.

Figure 3A:
FIGS. 3A-3L show a preferred method of making the semiconductor device in the invention.
Figure 3B:
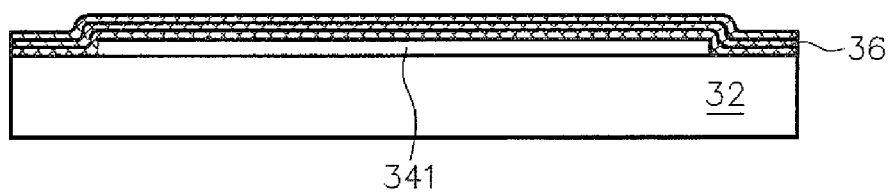
Figure 3C:
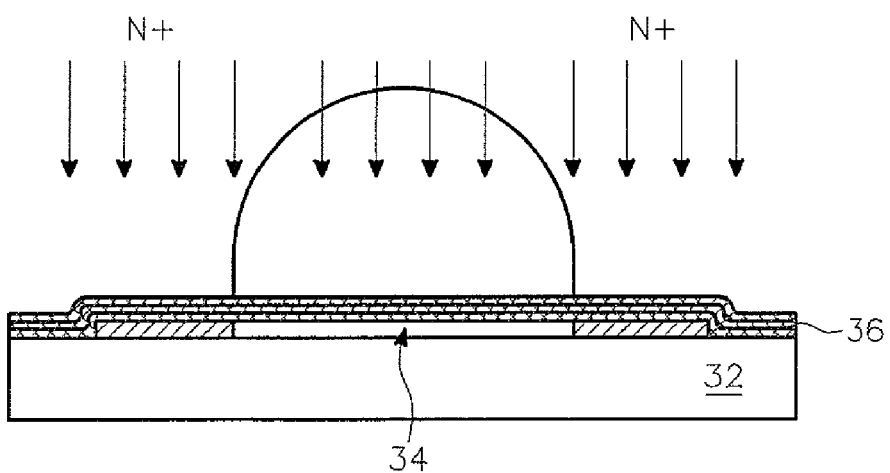
Figure 3D:
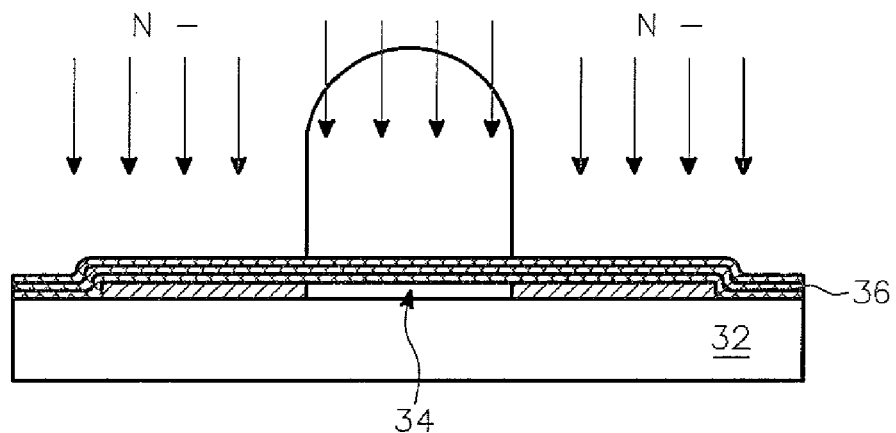
Figure 3E:
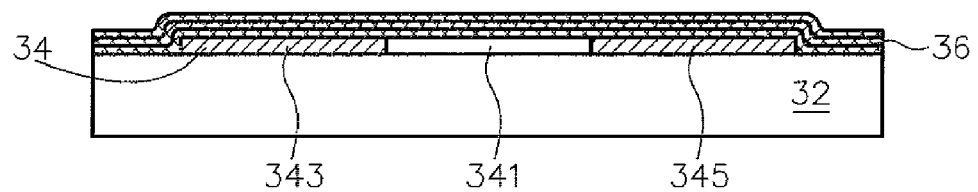
Figure 3F:
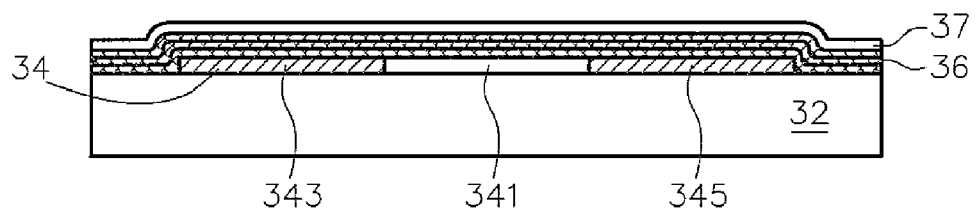

Referring to FIG. 3A to FIG. 3L, a method of making the semiconductor device in accordance with the present invention is shown. As shown in FIG. 3A, an amorphous Si (α-Si) film is deposited on the substrate 32. Then, the α-Si film crystallizes to form a polycrystalline Si layer 34 by means of a laser annealing process. As shown in FIG. 3B, a gate insulator 36 is formed as a multi-layer structure on the polycrystalline film 34. In FIGS. 3C-3E, an ion implantation process is performed to define a source 343 and a drain 345 in two sides of the polycrystalline film 34 and to define a channel 341 in a central region of the polycrystalline film 34. FIG. 3C shows that positive ions are implanted into the polycrystalline film 34 at a high speed. FIG. 3D shows the implantation process of negative ions. The positive ions and the negative ions are cross-implanted into the polycrystalline film 34 repeatedly until a desired ion concentration is reached in both sides of the polycrystalline film 34. The ion activation process shown in FIG. 3E is performed to activate these ions under a temperature between 400° C.-600° C. so that the polycrystalline film 34 can present the property of the semiconductor.

Figure 3G:
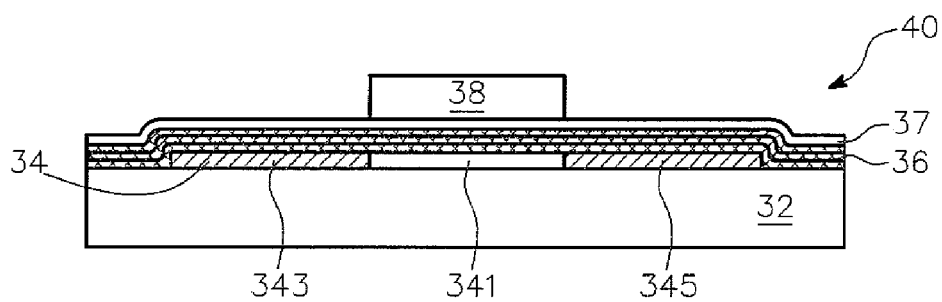
Figure 3H:
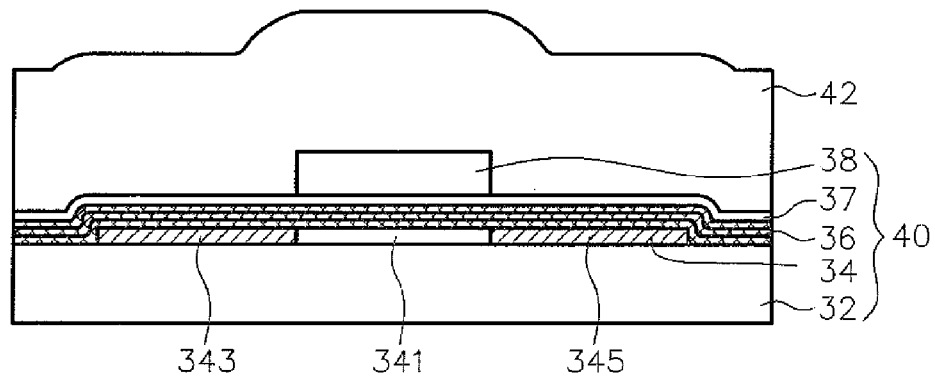

Subsequently, to accomplish the TFT 40 of the invention, a hydrogen-supplying film 37 is formed on the gate insulator 36 (FIG. 3F), and a gate electrode 38 formed on the hydrogen-supplying film 37 (FIG. 3G). It is noted that the aforesaid preferred embodiment is typical to an n-type thin film transistor. On the other hand, all the foregoing steps but only replacing the implanted ion type can be performed so as to achieve a p-type thin film transistor.

Figure 3I:
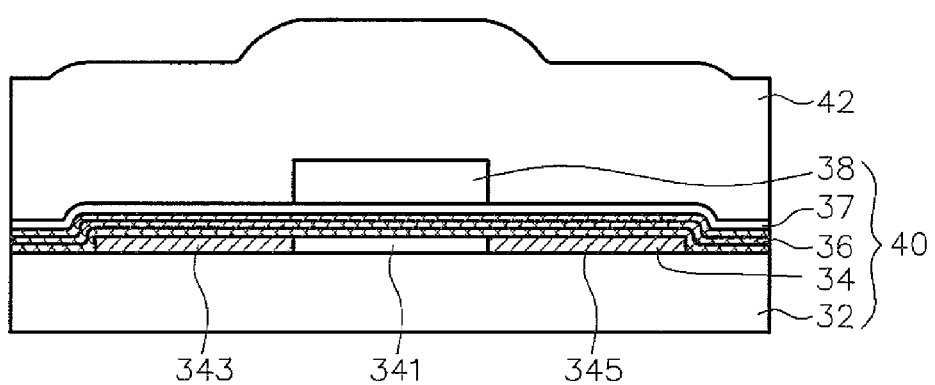

FIG. 3H to FIG. 3L show the latter process of making the semiconductor device 30 in accordance with the present invention. An inner dielectric layer 42 is formed on the TFT 40 to cover the gate electrode 38 and the hydrogen-supplying film 37. Subsequently, the semiconductor device 30 undergoes an annealing process to hydrogenate the channel 341 is of the polycrystalline film 34. As indicated in FIG. 3I, the hydrogen atoms of the hydrogen-supplying film 37 and the gate insulator 36 can go into the channel 341 by thermal effusion so as to have unsaturated bonds of the polycrystalline film 34 transformed into hydrogen bonds for avoiding possible reduction in the carrier mobility of the channel 341. In the above process, the operational temperature is ranged between 300-420° C. and the process time is ranged between 20-60 minutes in the annealing process.

Figure 3J:
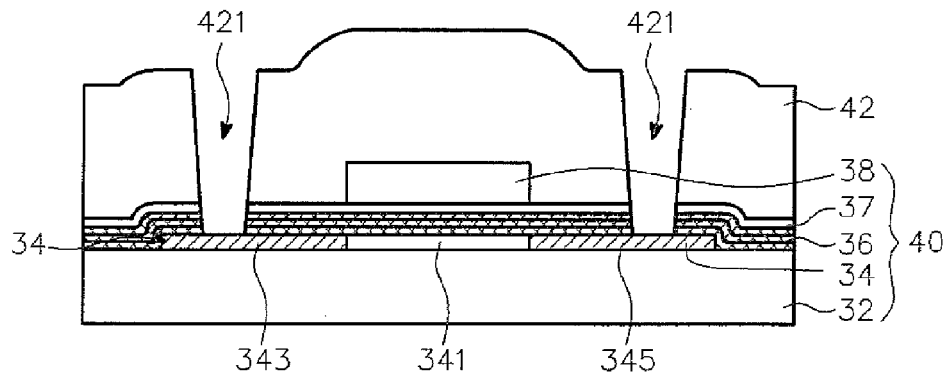
Figure 3K:
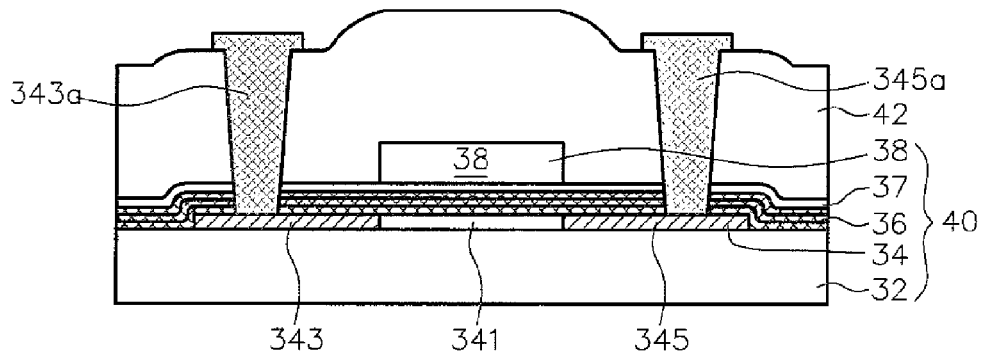
Figure 3L:
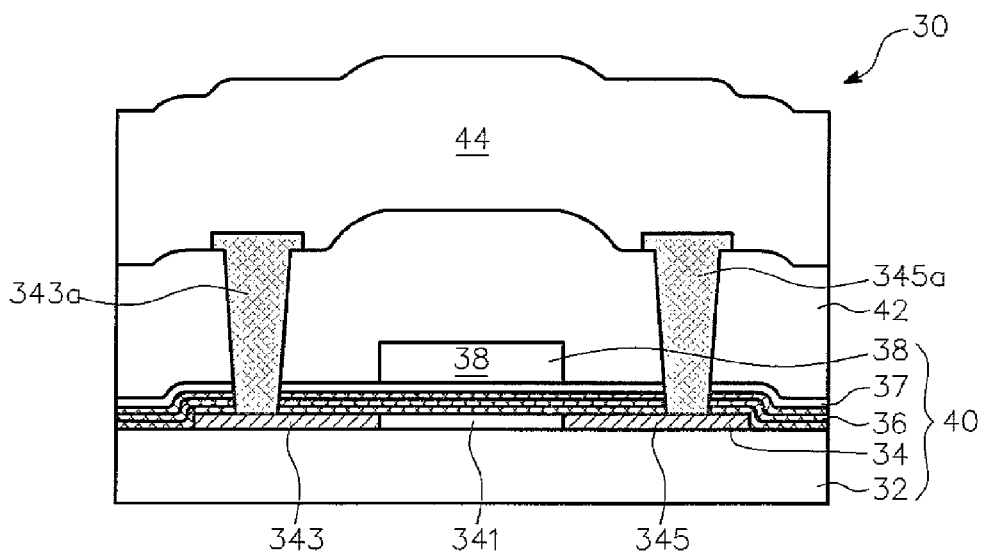

After the thermal effusion, the inner dielectric layer 42 is etched to form a pattern as shown in FIG. 3J, and to form the opening 421 above the source 343 and the drain 345 so that the source 343 and the drain 345 can be exposed. A metal is then deposited in the openings 421 to form two wires 343a, 345a. These two wires 343a, 345a extend through the inner dielectric layer 42 to further contact with the source 343 and the drain 345 respectively. As indicated in FIG. 3L, a passivation layer 44 is formed to cover the inner dielectric layer 42 so as to protect the semiconductor device 30. If the passivation layer 44 contains a substantial amount of silicon, escaping of the hydrogen atoms from the semiconductor device can be avoided. In the semiconductor device of this invention, the threshold voltage of the TFT can be increased by 1-2V and its carrier effective mobility can be increased by 5-20 $cm^2/V$.

It is noted in the present invention that the annealing process is performed after the inner layer dielectric 42 is formed. Also, shown in FIG. 2, after the passivation layer 44 is formed, the annealing process can be performed to hinder the escaping of hydrogen atoms.

Figure 4A:
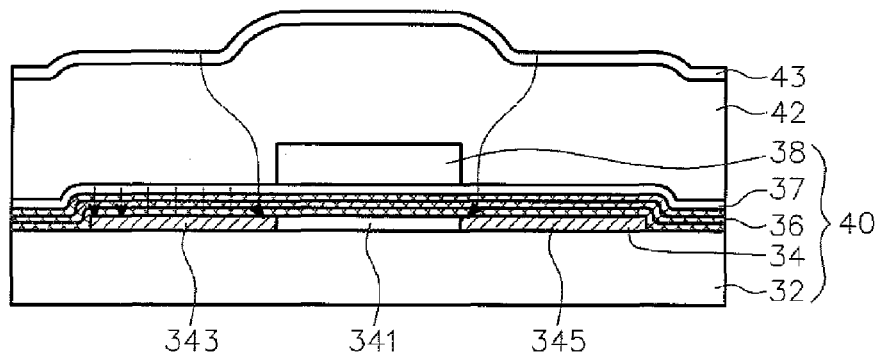
FIGS. 4A-4B shows another semiconductor having an internal TFT according to the invention.
Figure 4B:
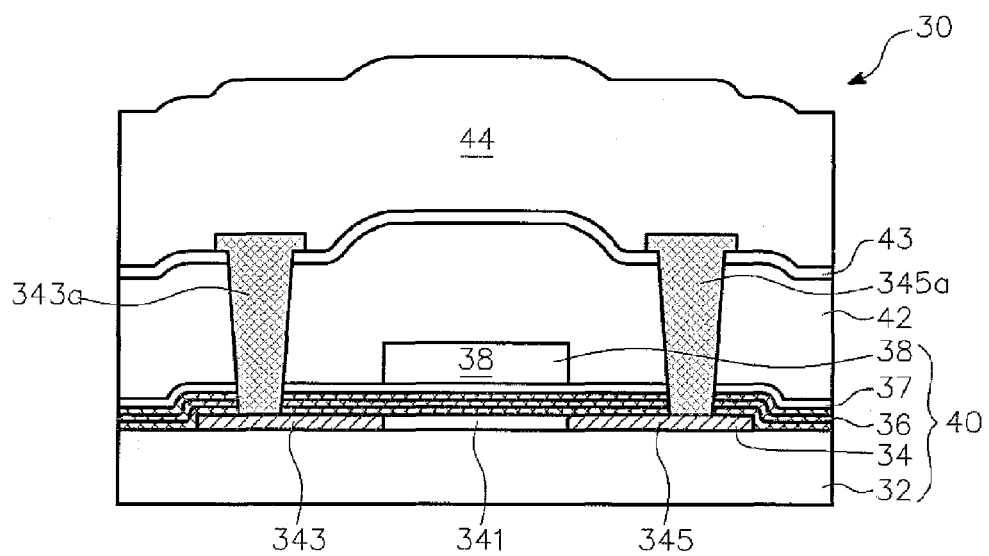

Another embodiment of the present invention is shown in FIG. 4A. Following the process of the FIGS. 3A-3I, a hydrogen film 43 (shown in FIG. 4A) is formed on the inner dielectric layer 42. An annealing process for is hydrogenation is applied to the hydrogen film 43 covering the inner dielectric layer 42 (comparing with FIG. 3I). The film 43 with hydrogen is used to prevent from further escaping of the hydrogen atoms. After the annealing process, the film 43 and the inner dielectric layer 42 are etched to form the openings above the source 343 and the drain 345 so that the source 343 and the drain 345 can be exposed (comparing with FIG. 3J). A metal is then deposited in the openings to form two wires 343a, 345a. These two wires 343a, 345a extend through the hydrogen film 43 and the inner dielectric layer 42 to further contact with the source 343 and the drain 345 respectively. Subsequently, a passivation layer 44 is formed to cover the hydrogen film 43 so as to protect the semiconductor device 30. The resultant semiconductor device by this process is shown in FIG. 4B (comparing with FIG. 3L). In this embodiment, the film 43 with hydrogen can be selected from a silicon nitride with hydrogen. Preferably, the thickness of the film 43 with hydrogen is between 950-1050 Å, the thickness of the inner dielectric layer 42 is between 3000-5000 Å, and the thickness of the passivation layer 44 is between 3000-5000 Å.

By providing the present invention, a hydrogen-supplying film can be formed between the gate electrode and the channel of the polycrystalline film, such that the LTPS-TFT can be better hydrogenated to improve the current-voltage characteristic and its operational efficiency. Also, comparing with the conventional LTPS-TFT having a passivation layer with hydrogen, this invention can reach a desired degree in hydrogenation in a shorter time.

In the above described, at least one preferred embodiment has been elucidated with reference to drawings annexed, it is apparent that numerous variations or modifications may be made without departing from the true spirit and scope thereof, as set forth in the claims below.

We claim:

1. A method of manufacturing a semiconductor device, comprising:
    forming a polycrystalline film on a substrate;
    forming a gate insulator on the polycrystalline film;
    implanting ions into the polycrystalline film;
    forming a source and a drain in both sides of the polycrystalline film and a channel therebetween;
    forming a hydrogen-supplying film on the gate insulator;
    forming a gate electrode on the hydrogen-supplying film;
    forming an inner dielectric layer to cover the gate electrode and the hydrogen-supplying film;
    performing an annealing process to diffuse hydrogen atoms from the hydrogen-supplying film to the channel so as to transform unsaturated bonds into hydrogen bonds in the polycrystalline film;
    forming a hydrogen film on the inner dielectric layer;
    applying another annealing process to the hydrogen film;
    forming two wires to extend through the inner dielectric layer and the hydrogen film so as to contact with the source and the drain, respectively; and
    forming a passivation layer to cover the inner dielectric layer, wherein the passivation layer includes a silicon nitride with a plurality of hydrogen atoms.

2. The method of claim 1, wherein the step of forming a source and a drain in both sides of the polycrystalline film and a channel therebetween comprises performing an ion implantation process to define a source and a drain in both sides of the polycrystalline film and a channel therebetween.

3. The method of claim 1, wherein said ion implantation process includes an ion activation process to activate ions in the source and the drain.

4. The method of claim 1, wherein said hydrogen-supplying film includes tetraethyl-orthosilicate (TEOS).

5. The method of claim 1, wherein said gate insulator includes tetraethyl-orthosilicate (TEOS).

6. The method of claim 1, wherein the temperature of said annealing process is between about 300° C. and 420° C.

7. The method of claim 1, wherein the time period of said annealing process is between about 20 min and 60 min.

8. The method of claim 1, wherein said gate insulator is a multi-layer structure of tetraethyl-orthosilicate (TEOS).

9. The method of claim 1, wherein the gate insulator has less hydrogen atoms and hydrogen-supplying film has rich hydrogen atoms.

10. A method of manufacturing a semiconductor device, comprising:
    forming a polycrystalline film on a substrate;
    forming a gate insulator on the polycrystalline film;
    forming a source and a drain in both sides of the polycrystalline film and a channel therebetween;
    forming a hydrogen-supplying film on the gate insulator;
    forming a gate electrode on the hydrogen-supplying film;

forming an inner dielectric layer to cover the gate electrode and the hydrogen-supplying film;

performing an annealing process to diffuse hydrogen atoms from the hydrogen-supplying film to the channel so as to transform unsaturated bonds into hydrogen bonds in the polycrystalline film;

forming a hydrogen film on the inner dielectric layer;

applying another annealing process to the hydrogen film; and forming two wires to extend through the inner dielectric layer and the hydrogen film so as to contact with the source and the drain, respectively; and forming a passivation layer to cover the inner dielectric layer, wherein the passivation layer includes a silicon nitride with a plurality of hydrogen atoms.

* * * * *